United States Patent [19]

Page

[11] Patent Number: 4,658,209
[45] Date of Patent: Apr. 14, 1987

[54] UNIVERSAL TEST BOARD, SERIAL INPUT (FOR SYNTHESIZER TESTING)

[76] Inventor: Robert E. Page, 1945 Willow La., San Diego, Calif. 92106

[21] Appl. No.: 575,106

[22] Filed: Jan. 30, 1984

[51] Int. Cl.⁴ .................. G01R 31/00; G01R 31/28; G06F 11/00
[52] U.S. Cl. .................................. 324/73 R; 371/17
[58] Field of Search .................. 324/73 R, 73 AT; 371/16, 27, 17, 25, 21; 370/13

[56] References Cited

U.S. PATENT DOCUMENTS

| | | | |
|---|---|---|---|
| 3,302,109 | 1/1967 | Jones | 324/73 R |
| 3,518,413 | 6/1970 | Holtey | 371/16 |
| 3,688,263 | 8/1972 | Balogh, Jr. et al. | 371/16 |
| 3,790,885 | 2/1974 | James | 324/73 R |
| 3,813,531 | 5/1974 | King et al. | 317/71 |
| 4,326,290 | 4/1982 | Davis et al. | 371/21 |
| 4,383,312 | 5/1983 | Reed | 370/13 |

Primary Examiner—Ernest F. Karlsen

[57] ABSTRACT

An electronic system that processes or otherwise acts upon a serial data stream can be monitored at any one of several points to provide an indication that specific parts as well as the whole system are functioning properly. A selected digital address is dialed on a thumbwheel switch that provides a signal indicative of a particular time slot within a repetitive sequence of time slots and a counter produces a series of digital addresses that are representative of a repetitive sequence of time slots to enable a comparison and generation of a latch signal at the particular time slot indicated. A probe is placed in electrical engagement with that portion of the signal corresponding to the selected digital address and a series test input signal is drawn from the system. The serial test input signal is converted from serial form to parallel form and a digital to analog converter generates a representative analog output signal that may be compared with a standardized analog signal that should be present at the desired point in the system when all components are functioning properly. Various synchronizing and clock signal rates can be provided to give the test apparatus the capability for accommodating differently sized signals for generating in different test analog signals.

7 Claims, 5 Drawing Figures

UNIVERSAL TEST BOARD, SERIAL INPUT (FOR SYNTHESIZER TESTING)

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Testing devices for providing an indication of a circuit condition are many and varied in design. In complex systems that perform complex functions it is sometimes difficult to locate where the capabilities of certain of the components have gone awry. While conventional volt meters, amp meters or ohm meters help give an indication where a defect may be, these meters usually require considerable training to use them properly in a complex system and when the meters themselves become impaired, the indications they provide might be erroneous.

The modular approach for complex system design allows a more rapid testing of a large group of components on a circuit board; yet the savings in time are not without a price. Usually an elaborate and highly specialized test plug-in fixture is needed to enable the rapid testing of a complex module. When a number of slightly different modules are used in a sophisticated electronics system, the number of test fixtures must also be increased at a consequential greater cost, need for greater storage space and requirement for longer shelf life between activations and use. In addition, discarding an entire complex module because one small component may be inoperative might not be cost effective.

Thus, a continuing need exists in the state of the art for a test instrument that enables a spot by spot checking of a serial data stream in an electronics system that can localize a defective portion to allow its economical repair.

SUMMARY OF THE INVENTION

The present invention is directed to providing an apparatus for selectively monitoring a serial data stream within a repetitive sequence of time slots at a desired point in a system and for providing a representative analog output signal. A selectively variable switch provides a selected digital address signal representative of a particular time slot within the repetitive sequence of time slots and a counter circuit iteratively produces a series of digital address signals that are representative of all the repetitive sequence of time slots. A comparator circuit is coupled to receive the selected digital address signals from the variable switch and the series of digital signals from the counter for comparing and indicating a coincidence when the selected digital address signals correspond to the address signals of one of the series of digital address signals. When this comparison has been indicated a latching signal is generated which is fed to a series-to-parallel converter. The series-to-parallel converter is coupled to a test probe which is electrically coupled to the desired point in the system and passes the serial test input signal which is converted to parallel form upon receipt of the latch signal. A digital-to-analog converter is responsive to the parallel form of the serial test input signal for generating a representative analog output signal to enable a comparison with a standardized analog signal that should be present at the desired point in the system when all components are functioning properly.

A prime object of the invention is to provide a test apparatus enabling the selective monitoring of a serial data stream at any desired location within a system.

Another object is to provide an electronic test apparatus having a probe selectively positionable at any one of a number of desired test points within a system and a variable address switch that cooperates with other test circuitry to enable the monitoring of operational characteristics at discrete points within an electronic system.

Yet another object is to provide a test apparatus having the capability for generating an analog signal from a series test input signal from a desired point within a system to enable the checking of particular components within a system.

Still another object of the invention is to provide a test apparatus that provides representative analog signals that enable a comparison with a standardized analog signal that should be present at the desired test point in a system when all components are functioning properly.

Still another object of the invention is to provide an electronic system test apparatus that enables a selective testing of discrete components for isolating system faults by means of a single test apparatus.

A further object is to provide a test apparatus having a selectable address feature that enables the selectable monitoring of any one of a number of desired points for providing representative analog output signals.

These and other objects of the invention will become more readily apparent from the ensuing specification and claims when taken in conjunction with the appended drawings.

DESCRIPTION OF THE PREFERRED EMBODIMENT

Figure 1:
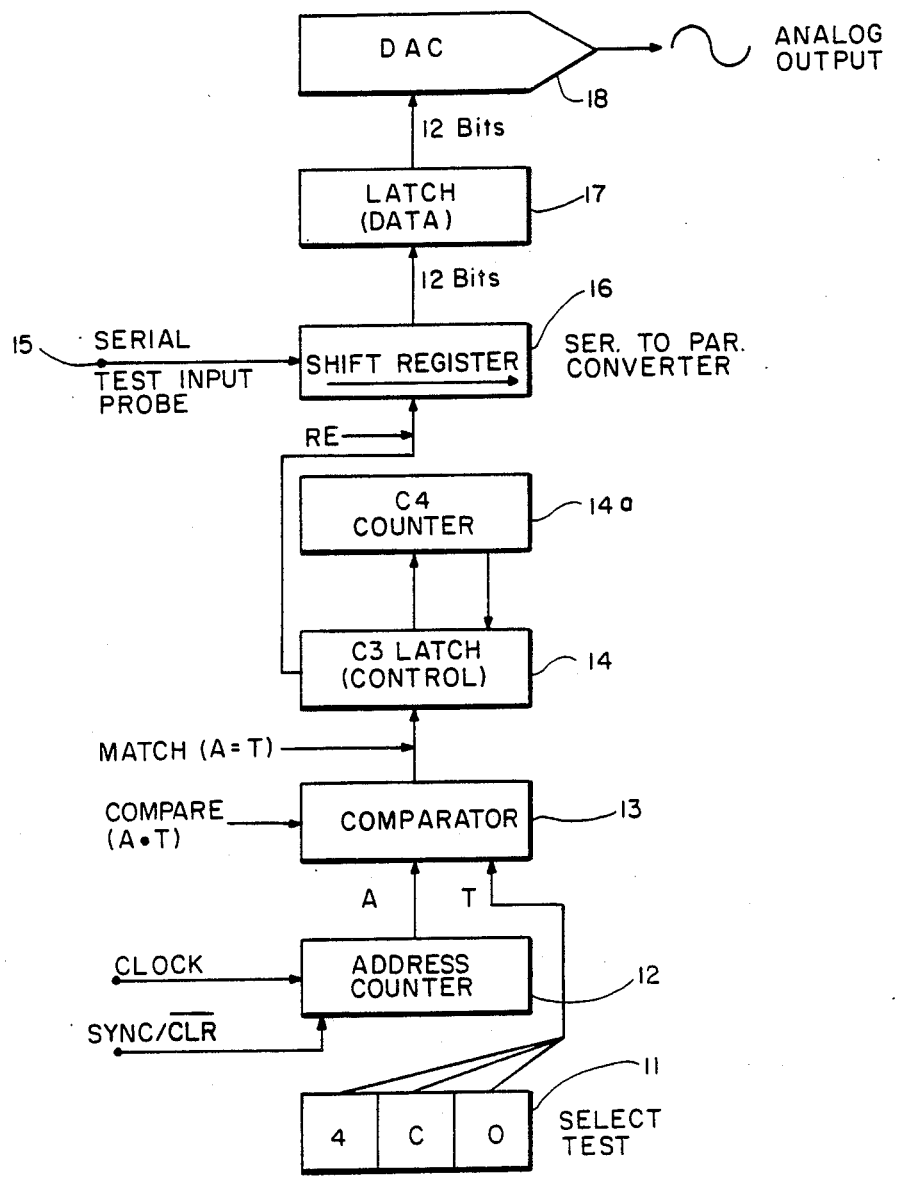
FIG. 1 is a block diagram showing the principle constituents of the test apparatus for electronic systems.
Figure 4A:
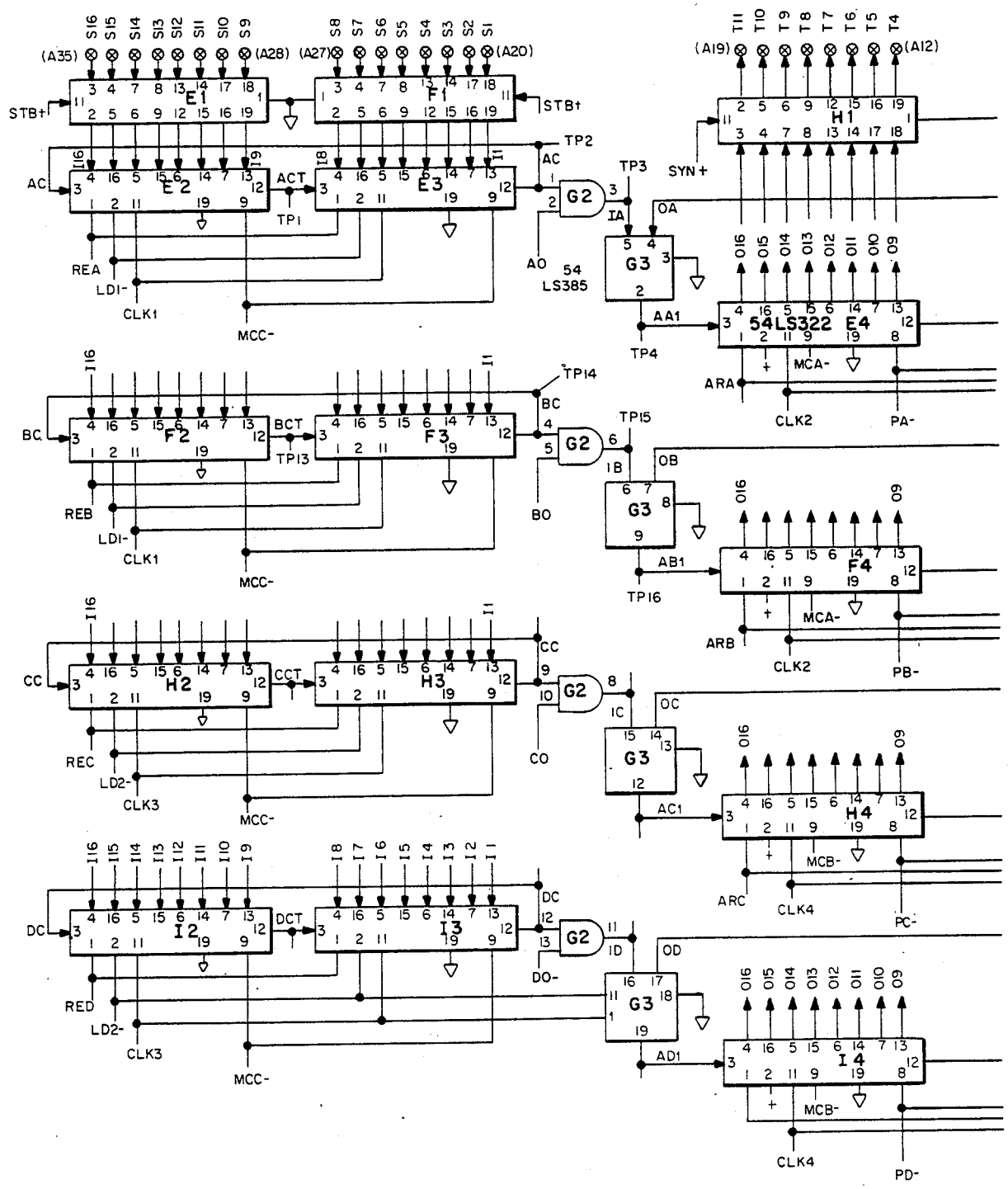
FIGS. 4a and 4b show a portion of a typical complex electronic system for which the novel testing capabilities of this invention are ideally suited.
Figure 4A:
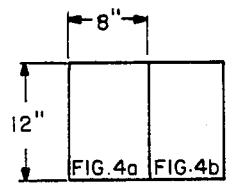
Figure 4B:
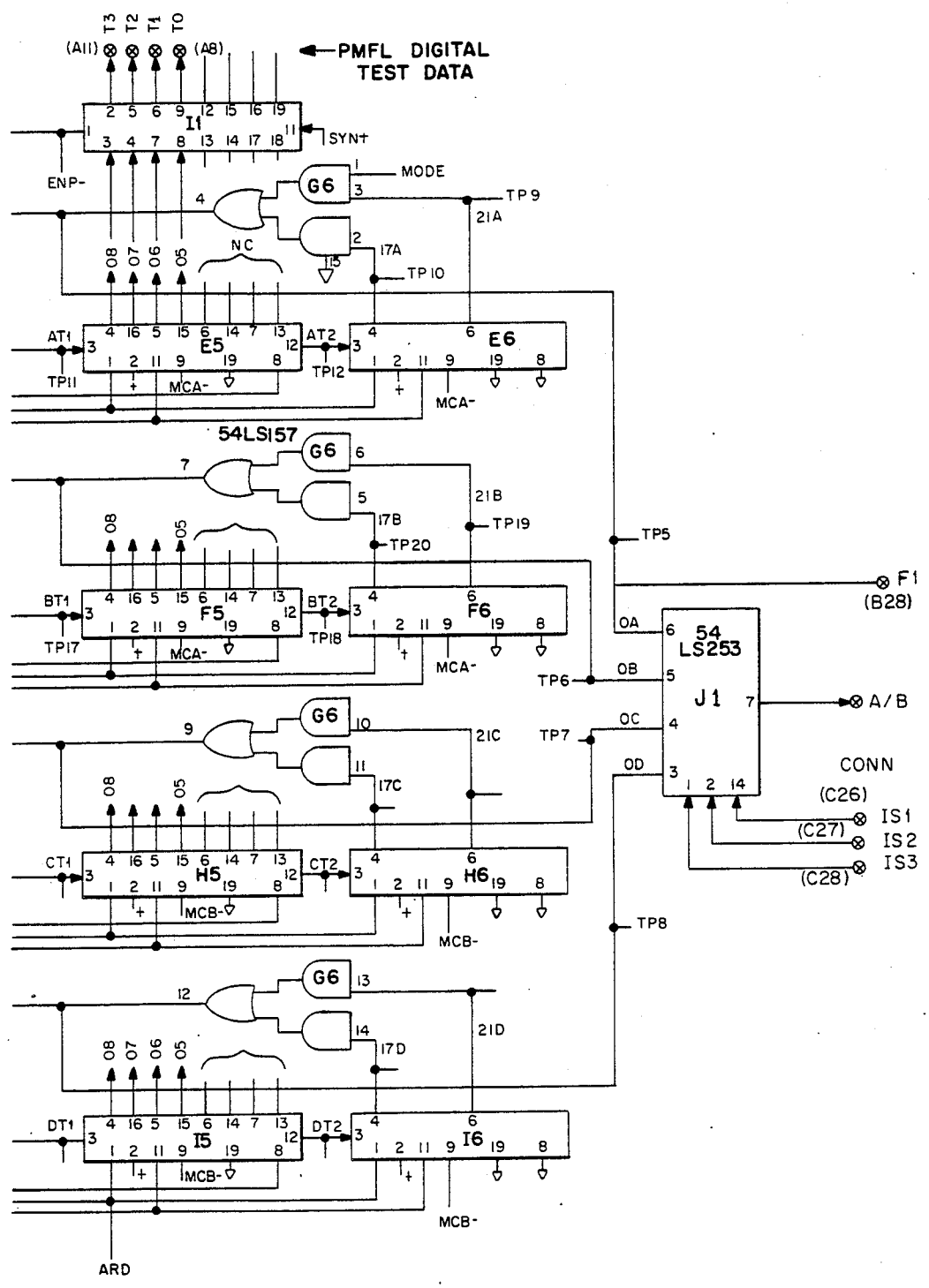

Referring now to the drawings and in particular to FIG. 1, a testing apparatus 10 gives technicians and engineers a highly reliable tool for monitoring the performance of a large and complex electronic system S such as that shown in FIGS. 4a and 4b. The system has a number of test points that are depicted by the reference characters TP1 through TP36 in the representative circuit of FIGS. 4a and 4b. The test points can be located anywhere desired in the circuit and have pre-established monitored analog waveforms which are generated when a particular serial data stream is being fed through the system. These waveforms are standardized analog signals which are determined from a previous analysis, for example, during fabrication of the system itself. In any event, the number of test points within the system are extensive so that the performance throughout the system can be monitored to isolate a system failure to within a few defective components to enable their rapid and cost effective replacement.

The test apparatus has a great flexibility for selecting the analog waveform to be monitored at many test points by including a selective switch 11. The switch that is selected can be any one of a variety which will provide a selected digital address signal. A manual three-digit hexadecimal thumbwheel switch manufactured by the Pasadena Cal Corp. of Digitran under the designation Digiswitch, Model 36455013 has been selected to provide a representation of a digital number that, in this case, represents a time slot in a repetitive series of time slots. This digital number can be changed by merely rotating the wheels of the switch to effect the most significant digit, intermediate number digit and the least significant digit. Appropriate signals through the output connections $A_o$ through $A_{10}$ of the switch are provided as well as additional most significant digit and least significant digit signals which determine, selectively, different clock rates and sync rates to be fed to the system.

The different clock rates and different sync rates originate in suitably provided oscillators, which have been deleted from the drawings to avoid belaboring the obvious. The different clock rates and sync rates are functions of the systems to be tested and the rates of the serial data stream within the different systems. A typical sync rate of 30 KHz establishes the repetitive start of each repetitive cycle of clocking pulses each of which occupies one separate time slot in a repetitive sequence of time slots. Having a typical clock rate of 3.27 megahertz gives 109 clock pulses or reoccurring time slots in each cycle.

The selected sync rates and clock rates are coupled to a serial counter circuit 12 which produces, in the case of a sync signal of 30 kHz and a clock rate of 3.27 megahertz, 109 clock pulses per sync pulse so that the three integrated circuit elements A1, A2, A3 in counter circuit 12 produce a reoccurring series or cycle of digital address signals that are representative of the repetitive sequence of time slots. This iterative reproduction of the digital address signals, the rate of which is determined by the sync and clock pulses, is fed to a comparator cicuit 13.

The comparator circuit formed of the three components B1, B2 and B3 receive the reoccurring sequences of the digital address signals from counter 12 as well as the selected digital address as determined by thumbwheel switch 11. The thumbwheel switch 11 outputs are designated on the comparator as inputs $A_0$ through $A_{10}$ in FIG. 2. When coincidence occurs between the selected digital address generated by the thumbwheel switch and the particular digital address signals within the series of digital address signals generated by counter 12, a gating signal is passed through gate 13a (C2) and is indicated by the reference character (CMP). The CMP signal is received by a latch circuit 14 (C3) which feeds the latching signal to a latch counter circuit 14a (C4). The latch counter circuit provides a feedback signal back for latch circuit 14 and assures the generation of a continuous latching signal RE from the latch circuit for period of duration equal to a predetermined quantity of clock pulses. The time for twelve consecutive clock pulses has been discovered as being a sufficient time period for the testing operation of a typical circuit and will be elaborated on below. Shorter or longer periods might prove to be acceptable for other circuits and data rates.

A test probe 15 is mechanically coupled to a test point in the circuit for extraction of a series test input signal. This chosen test point can be located in any one of several points in the system. The particular series test input signal from one test point or another varies with respect to the location of the desired test points in the system. Each test input signal is extracted from the system at a particular time slot as established by the clock pulses between the successive sync pulses.

The test probe couples the serial digital stream to a serial to parallel converter 16 formed of components D1 and D2. The latching pulse RE coming from latch 14 actuates the serial to parallel converter 16 to pass the particular series test input signal during the duration of the latch pulse. As stated above the duration is for twelve clock pulses. The clock pulses clocking in the serial digital stream in the serial to parallel converter are at the same rate as that fed to counter circuit 12.

The serial test input signal starting at the preselected address designated by the thumbwheel counter is converted into parallel form and is fed to a latch circuit 17. This latch circuit stores the twelve clock pulse duration signal until the next twelve clock pulse duration signal is received by latch circuit 17 in the next successive cycle. The latched twelve clock pulse duration signal is fed to a digital to analog converter 18 that creates a representative analog signal. Successive analog output signals are used for comparison purposes. The representative analog output signal is compared to a predetermined or standardized analog signal that should be present at the desired test point in the system when the associated components are functioning properly.

Figure 2:
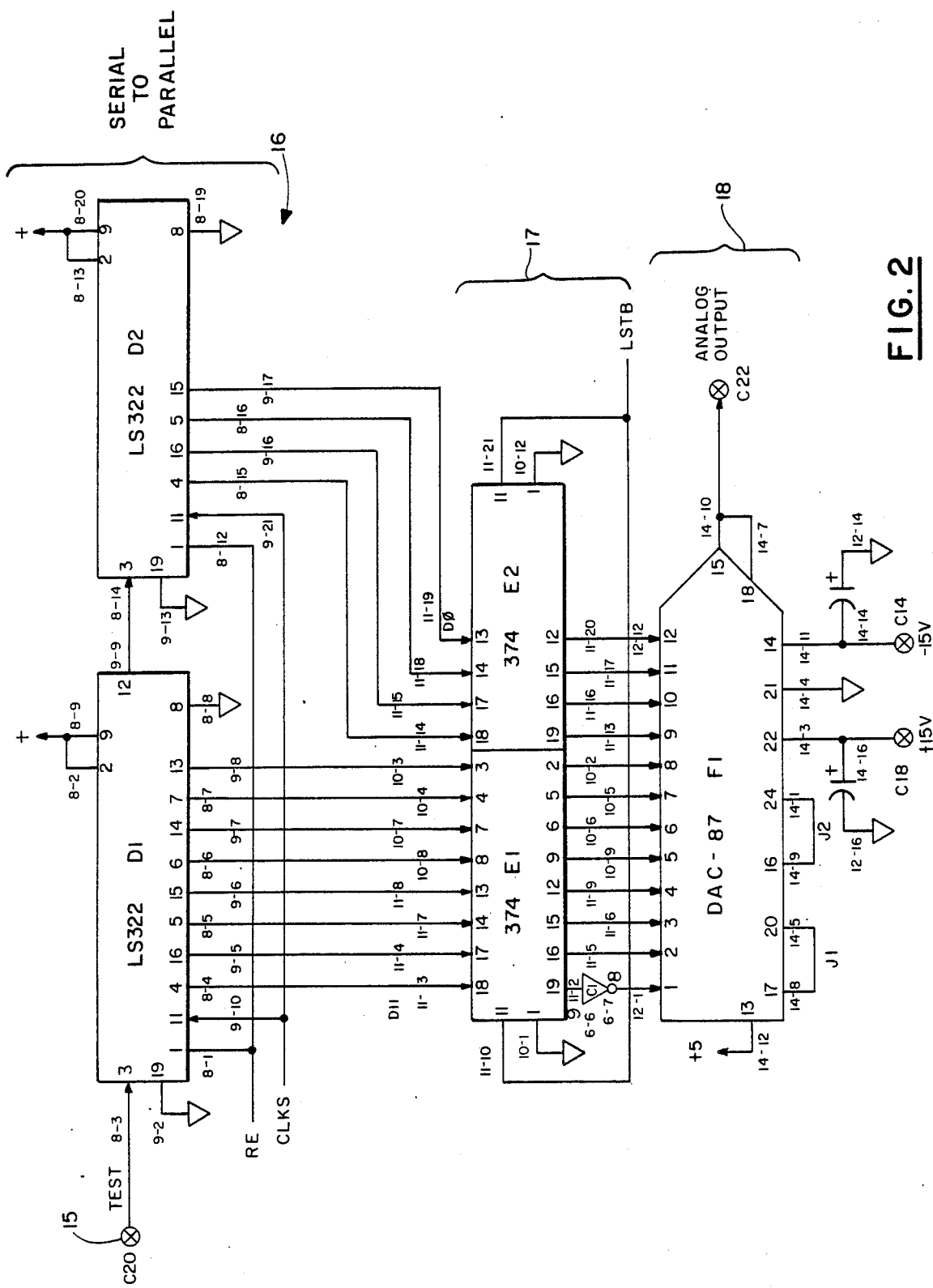
FIGS. 2 and 3 show in detail the circuit components which are functionally identified in FIG. 1.
Figure 3:
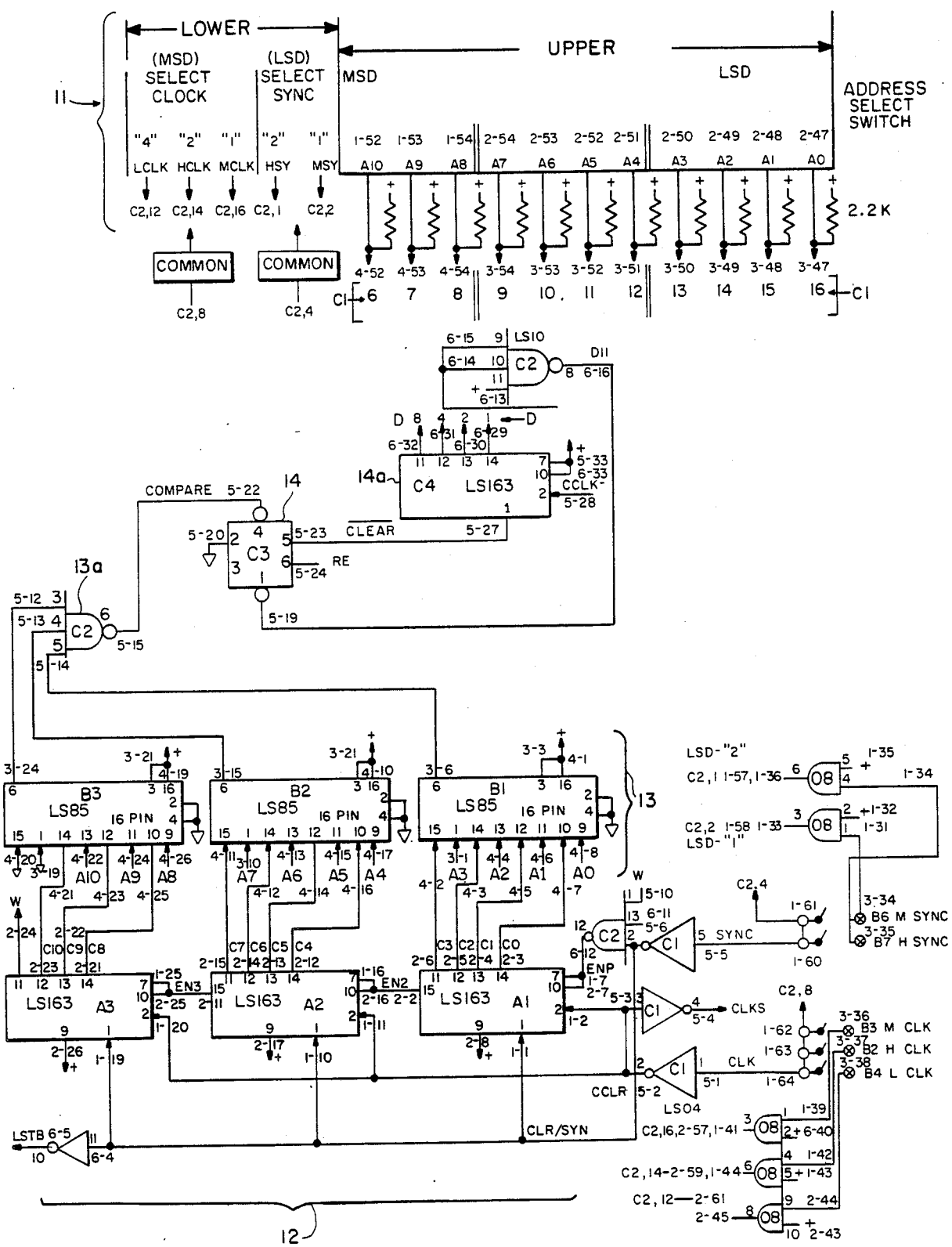

The integrated circuits and interconnections that make up the constitutents of the test apparatus are identified in sufficient detail in FIGS. 2 and 3 of the drawings to enable one skilled in the art to which this invention pertains to gain a complete understanding and appreciation of the salient features of this inventive concept. Various system syncs and clocks could be provided to accommodate different electronic systems to be monitored and the inclusion of such sync and clock circuitry has been dispensed with for the sake of brevity. The apparatus of this inventive concept could be packaged in a variety of ways to enhance reliability such as providing common circuit boards potted, shielded and otherwise protected from ambient influences.

Obviously, many modifications and variations of the present invention are possible in the light of the above teachings. It is therefore to be understood that within the scope of the appended claims the invention may be practiced otherwise than as specifically described.

What is claimed is:

1. An apparatus for selectively monitoring a serial data stream within a repetitive sequence of time slots at a desired point in a system and for providing a representative analog output signal comprising:

means for providing a selected digital address signal representative of a particular time slot within the repetitive sequence of time slots;

means for iteratively producing a series of digital address signals that are representative of all the repetitive sequence of time slots;

means coupled to the selected digital address signal providing means and the series of digital address signals iteratively producing means for comparing and indicating coincidence signals when the selected digital address signals correspond to the address signals of one in the series of digital address signals;

means connected to the comparing and indicating means for creating a latch signal for the time starting when the coincidence signals occur;

means adapted to be completed to the desired point in the system for passing a series test input signal from the data stream in the system;

means connected to the latch signal creating means and the serial test inputs signal passing means for converting the serial test input signal to parallel signals upon receipt of the latch signal; and means connected to the serial to parallel converting means for generating the representative analog output signal to enable a comparison with standardized analog signals that should be present at the desired point in the system when all components are functioning properly.

2. An apparatus according to claim 1 further including:

means interposed between the serial to parallel converting means and the analog output signal generating means for latching the parallel signals to stop the serial shifting in the serial to parallel converting means.

3. An apparatus according to claim 2 further including:

a source for sync signals connected to the series of digital address signals iteratively producing means and a source of clock signals connected to the series of digital address signals iteratively producing means and the serial parallel converting means.

4. An apparatus according to claim 3 in which the source of sync signals and source of clock signals have varying rates to accommodate diffeent serial data streams and sequences of time slots.

5. An apparatus according to claim 4 in which the selected digital address signal providing means is a three digit hexadecimal switch that can select different digital address that correspond to different points in the system within different time slots.

6. An apparatus according to claim 5 in which the iteratively producing means is a counter circuit fabricated from three LS163's.

7. An apparatus according to claim 6 in which the indicating and comparing means is a comparator fabricated from three LS85's.

* * * * *